United States Patent [19]

Surauer et al.

[11] Patent Number: 4,954,732
[45] Date of Patent: Sep. 4, 1990

[54] ADAPTIVE NONLINEAR FREQUENCY DOMAIN FILTER WITH LOW PHASE LOSS

[75] Inventors: Michael Surauer, Chieming; Helmut Bittner, Munich, both of Fed. Rep. of Germany

[73] Assignee: Messerschmitt-Bölkow Blohm GmbH, Munich, Fed. Rep. of Germany

[21] Appl. No.: 225,276

[22] Filed: Jul. 28, 1988

[30] Foreign Application Priority Data

Jul. 29, 1987 [DE] Fed. Rep. of Germany ....... 3725107

[51] Int. Cl.$^5$ .......................... H03K 5/00; H03K 1/00
[52] U.S. Cl. .................................... 307/520; 307/521; 328/167; 328/162; 328/139
[58] Field of Search ............... 329/139, 162, 165, 167, 329/188; 307/264, 520, 521, 549, 567, 494, 498; 328/167, 169, 165

[56] References Cited

U.S. PATENT DOCUMENTS

| 3,716,726 | 2/1973 | Trimble | 307/549 |
| 3,851,259 | 11/1974 | Porawski | 307/498 |
| 3,911,776 | 10/1975 | Beigel | 328/167 |
| 4,035,734 | 7/1977 | Flormann et al. | 328/167 |
| 4,277,695 | 7/1981 | Wilber et al. | 307/264 |
| 4,513,249 | 4/1985 | Baghdady | 328/167 |
| 4,625,238 | 11/1986 | Penney | 328/188 |

Primary Examiner—Timothy P. Callahan
Attorney, Agent, or Firm—Kenyon & Kenyon

[57] ABSTRACT

A nonlinear frequency domain filter serving for the suppression of unwanted signals which are superposed on a wanted signal variable in a given frequency range. The frequency domain filter comprises linear transmission members and a dead-zone member. With the filter, the zero point of the dead-zone member, to which the input signal to be filtered is supplied, follows proportionally the output signal of a pass-band filter connected in parallel with the dead-zone member. Further, the output signal of the pass-band filter is added to the output signal of the dead-zone member.

25 Claims, 13 Drawing Sheets

PRIOR ART

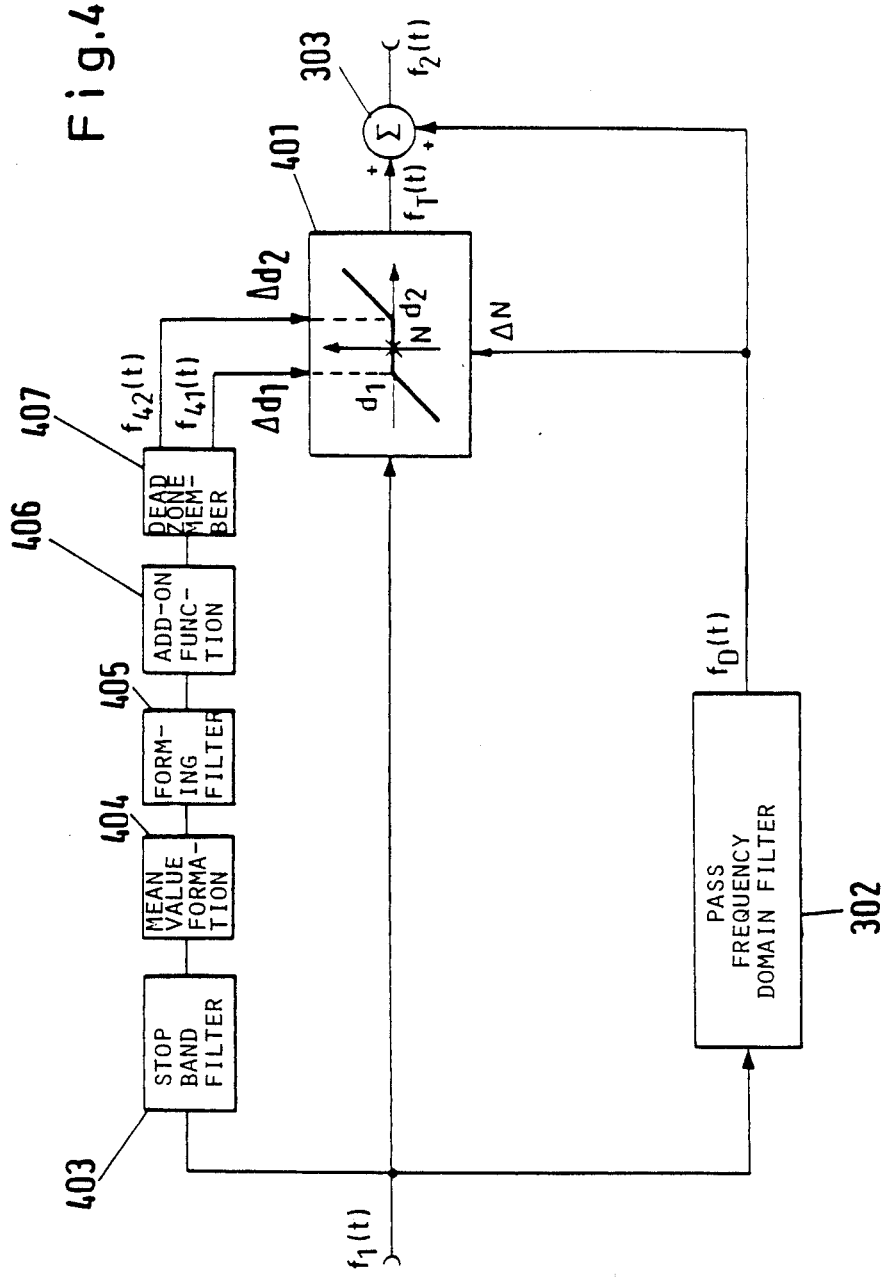

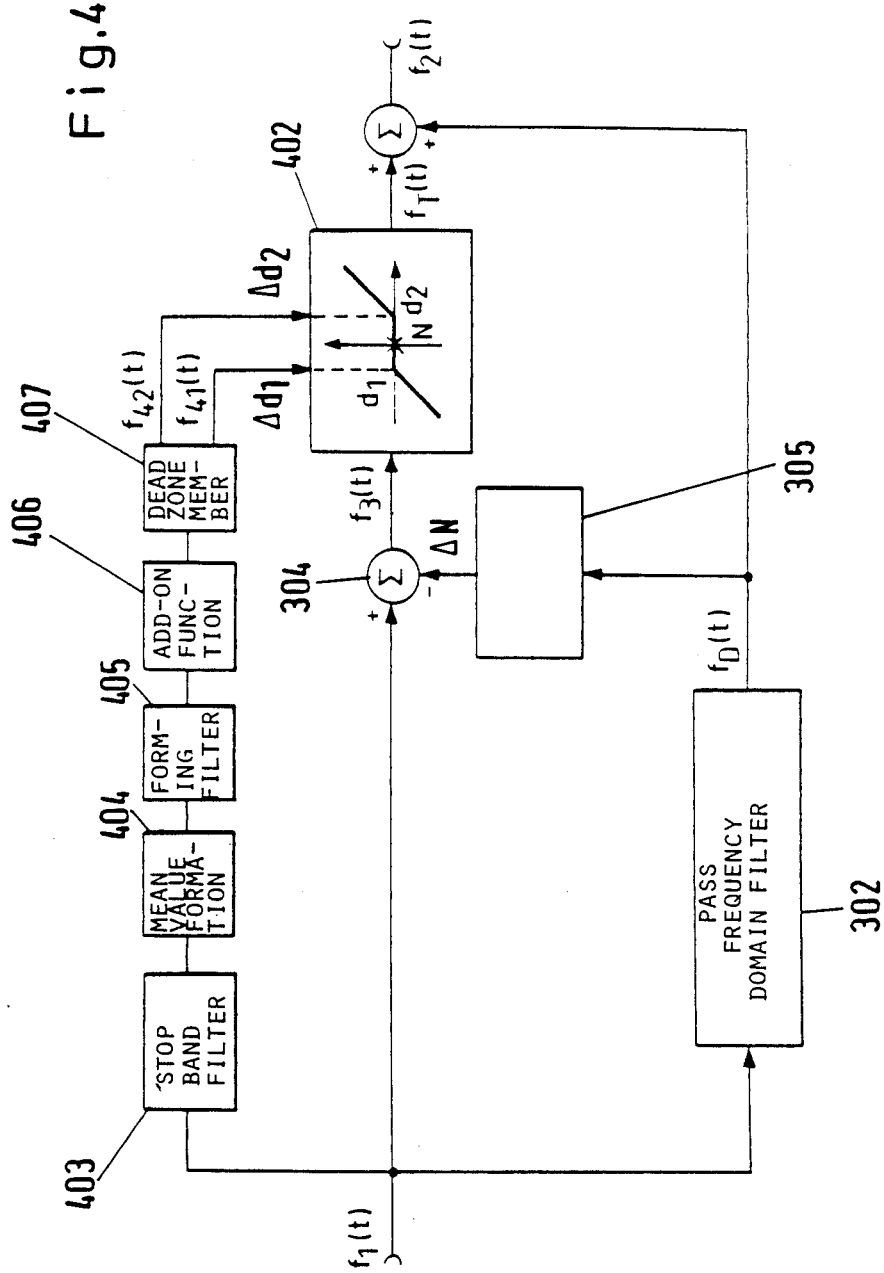

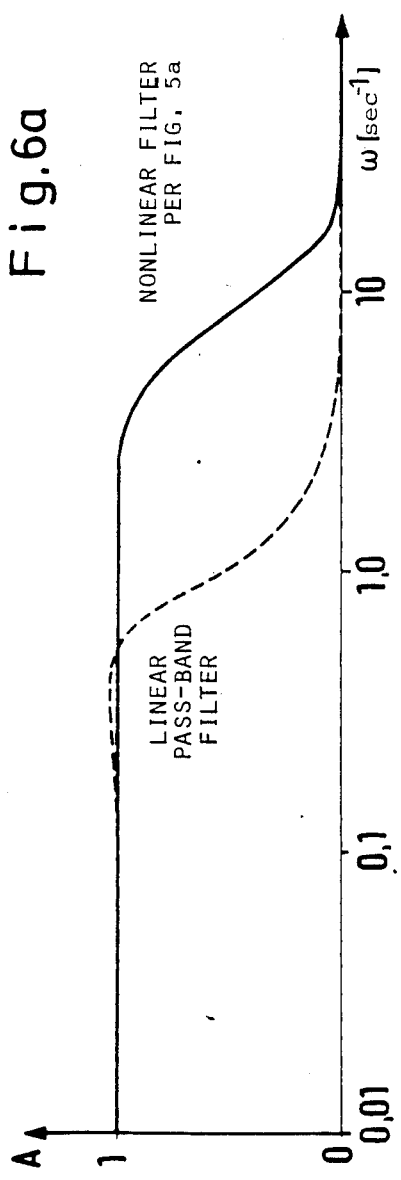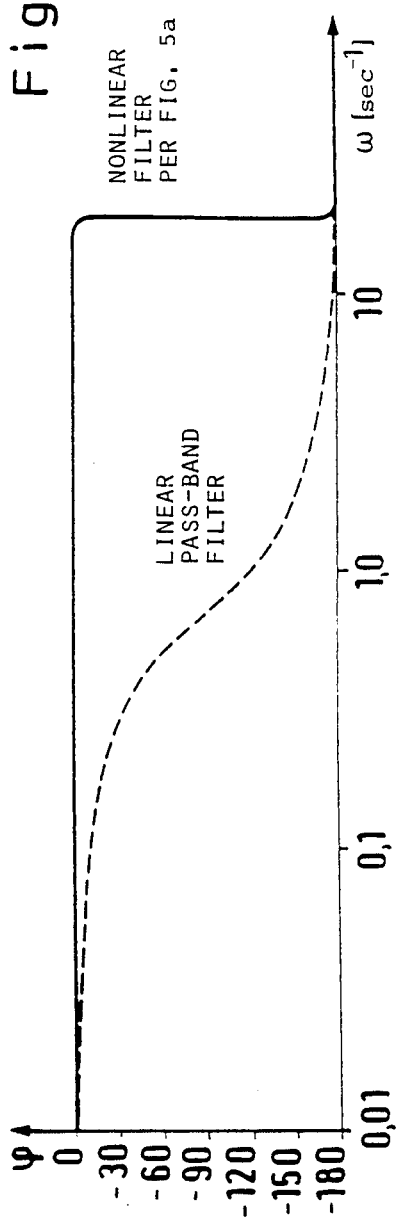

ADAPTIVE NONLINEAR FREQUENCY DOMAIN FILTER WITH LOW PHASE LOSS

BACKGROUND OF THE INVENTION

In telecommunications, measuring, signal processing and control engineering the requirement of separating wanted and unwanted signals comes up again and again. In most cases the stipulated requirements can be fulfilled by the use of known passive or active linear filters such as low-pass, high-pass, band pass filters and the like. Depending on their order and the selection of their adjustment parameters, for instance according to the rules of Butterworth, Chebyshev or Bessel, it is thereby possible to produce in known manner certain properties of their amplitude/frequency characteristics, e.g. with respect to residual ripple in the pass range, steepness of decay to the stop band and so forth. In a manner also known, with the selection of the amplitude characteristic there is singularly established at the same time also an associated phase response, where the phase loss increases with increasing frequency also with the filter order and steepness of decay to the stop band and is not negligible, in particular also in the useful range. When such filters are used in such feedback systems as control loops, phase-locked loops and the like, the phase/frequency response connected with the desired amplitude/frequency response often has an adverse effect on other indispensable requirements such as stability and signal-to-noise ratio.

SUMMARY OF THE INVENTION

The invention has now set itself the task of devising filter systems which break this rigid rule of the coupling of amplitude and phase response of the linear filters, that is, which improve this response in particular for the respective application with respect to phase loss and which moreover are able to automatically adapt to varying operating conditions, especially with respect to fluctuations of unwanted signal components.

The objects of the invention are achieved by linear transmission members in connection with a nonlinear transmission element, a dead-zone member, the zero point of which can be made to follow proportionally to the output signal of a pass band filter to which the input signal to be filtered can be supplied directly and to whose output signal the signal serving for zero point displacement is addable. According to a further development of the invention, also the absolute values of the response thresholds of the dead-zone member are to be adaptable between given lower and/or upper limit values continuously or in discrete steps.

BRIEF DESCRIPTION OF THE DRAWINGS

In the following, the features of the invention will be explained more specifically, starting from the state of the art (FIGS. 1a, 1b) with reference to specific embodiments (FIGS. 2-6).

FIG. 3b shows another form of realization of a filter according to the invention per FIG. 3a;

FIG. 4a shows a schematic representation of a double adaptive, nonlinear frequency domain filter according to a further form of the invention;

FIG. 4b shows another form of realization of a double adaptive frequency domain filter according to the invention per FIG. 4a;

FIG. 4c shows an additional extension of the double adaptable filter per FIGS. 4a and 4b for dynamic improvement of the intermediate frequency range per FIG. 3c;

FIG. 6a shows the amplitude/frequency response of a low-pass filter according to the invention per FIGS. 5a and 5b;

FIG. 6b shows the phase/frequency response of a low-pass filter according to the invention per FIGS. 5a and 5b.

DETAILED DESCRIPTION

Figure 1A:
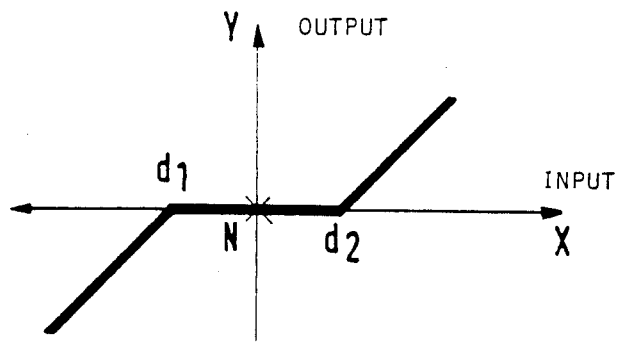
FIG. 1a shows the input/output characteristic of a normal, non-adaptable dead-zone member.

As has been mentioned, the nonlinear frequency domain filter according to the invention contains as an element an adaptive dead-zone member. FIG. 1 shows firstly the transmission characteristic of an ordinary dead-zone member. Such an element is defined as to its transmission properties by the fact that for input magnitudes which quantitatively lie below a certain given threshold value ($d_1$, $d_2$) it does not furnish an output signal, but reproduces input signal components in excess of the threshold values unchanged as to frequency and phase but with an amplitude reduced by the threshold value amount. Its mathematical functional definition, taking into consideration the correct signs of the threshold values ($d_1 \leq 0$, $d_2 \geq 0$) reads:

$$y = \begin{cases} x - d_1 & \text{for } x < d_1 \leq 0 \\ 0 & \text{for } d_1 \leq x \leq d_2 \\ x - d_2 & \text{for } x > d_2 \geq 0 \end{cases} \quad (1)$$

If the dead zone is realized as an algorithm in a programmable digital electronic system, this mathematical functional definition indicates the mathematical instruction directly. For the limit values ($d_1 = d_2 = 0$) the dead-zone member changes over into a linear transmission element with the transmission function "1".

Figure 1B:
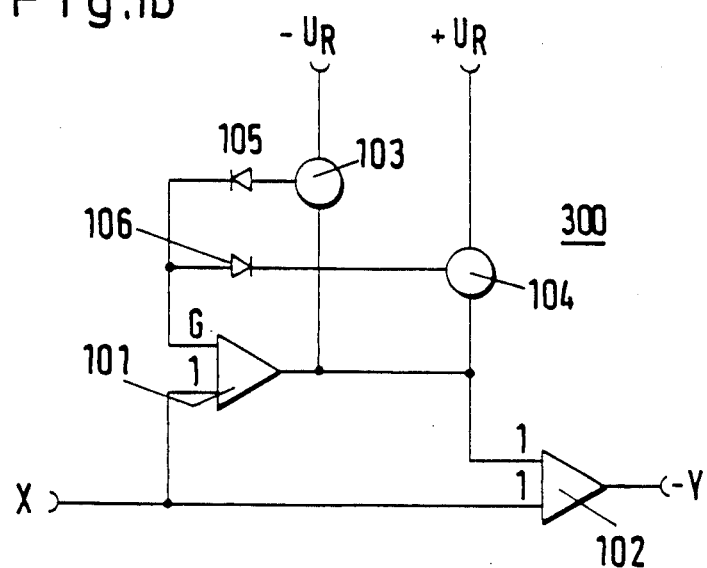
FIG. 1b shows a functional circuit diagram for the realization of a dead-zone characteristic according to FIG. 1.

FIG. 1b shows one realization of a conventional dead-zone member with fixed response thresholds ($d_1$, $d_2$) using operational amplifiers (101, 102), feedback potentiometers (103, 104) and diodes (105, 106). Determining for the positive response threshold ($d_2$) is the set value of a potentiometer (104) which lies between the output of an inverting operational amplifier (101) and a fixed positive reference voltage ($+U_R$) and whose tap is fed back to the input (G) of this first operational amplifier (101) directly, i.e. without series resistor, via a diode (106) connected in non-conducting direction with respect to the applied reference voltage. In their inverting inputs marked "1", both operational amplifiers (101, 102) are connected by appropriate series and feedback resistors as simple summing amplifiers. For positive input signals (x) below the response threshold ($d_2$) diode (106) blocks and the (negative) output signal ($-y$) remains 0, as the two signals (x) of equal size at the input of the second operational amplifier (102) just cancel each other out via the direct connection on the one hand, and via the phase-inverter amplifier (101), on the other hand. If the input quantity (x) of the dead-zone member just reaches the threshold value ($d_2$), the inverted value ($-d_2$) is present at the output of the first operational amplifier (101) and brings about that the potential at the tap of the connected potentiometer (104) just passes through 0, whereby the diode (106) connected there becomes conducting and shortcircuits the feedback resistor of the operational amplifier (101). Thereby the output signal of the first operational amplifier (101) remains constant at the negative threshold value ($-d_2$) even for higher input signals ($x-d_2$) and is subtracted from the input value in the following second operational amplifier (102). Analogous conditions result for negative input signals (x) of the dead-zone member in consideration of the threshold value ($d_1$) set via a second potentiometer (103) and in consideration of a diode (105) connected thereto. Simple reasoning familiar to a person of skill in the art shows that the desired threshold values ($d_1$, $d_2$) are realized at the following set values of the potentiometers (103, 104):

Pot. 103: $P_3 = d_1/(d_1 + U_R)$

Pot. 104: $P_4 = d_2/(d_2 + U_R)$ (2)

Deviations from this setting rule are due to the inevitable startup current ranges of the diodes (103, 104) and can be taken into account by a constant potential shift typical of the kind of diode used. If the response thresholds lie symmetrically to the zero point of the dead-zone member ($d_1 = d_2 = d$), the setting rule will accordingly be for both potentiometers (103, 104):

$$P = d/(d + U_r 3)$$ (3)

Figure 2A:
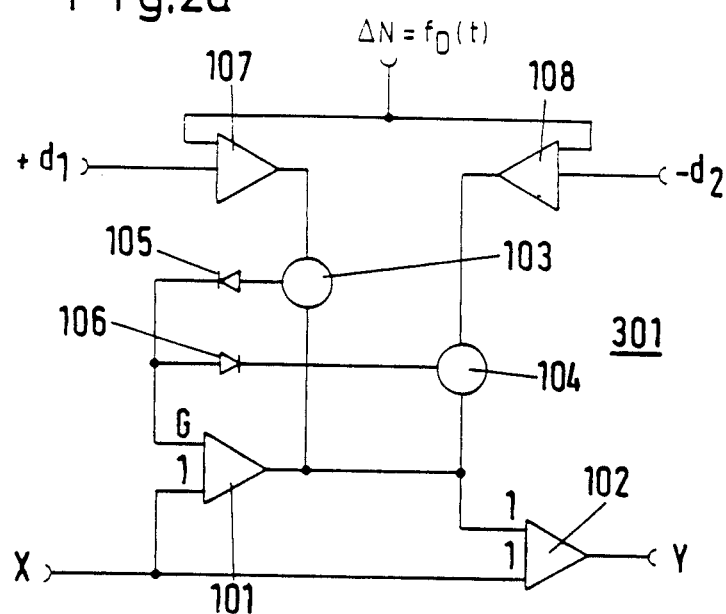
FIG. 2a shows a functional circuit diagram for the realization of a dead-zone member whose input/output characteristic (FIG. 1a) has a shiftable, i.e. adaptable zero point.

Now according to the invention, the zero point of the dead-zone member (N in FIG. 1a), and hence the entire input/output characteristic, is to be adaptable by means of an adaptation signal, i.e. variable with respect to the input signal (x) at constant distances of the threshold values ($d_1$, $d_2$) from the zero point, as can be achieved for example by a corresponding variation of the reference voltage ($U_R$). FIG. 2a shows a corresponding arrangement which derives from FIG. 1b by extension by two operational amplifiers (107, 108) for generating the reference voltage ($U_R$). At fixed set values of the potentiometers (103, 104) there result the input quantities required for maintaining the desired threshold values ($d_1$, $d_2$) for these additional operational amplifiers by simple transformation from equation (2) as:

$$d_1 = P_3 * U_R/(1 - P_3)$$

$$d_2 = P_4 * U_R/(1 - P_4)$$ (4)

or for symmetrical threshold values ($d_1 = d_2 = d$) and corresponding potentiometer settings ($P_3 = P_4 = P$) as $$d = P * U_R/(1 - P)$$ (5)

A parallel displacement of the response thresholds and hence also of the zero point (N) of the input/output characteristic by an adaptation value ($\Delta N$) is accomplished in a simple manner, as shown in FIG. 2a, by addition of a signal ($\Delta N$) scaled in the same manner as the threshold values ($d_1$, $d_2$) via the additional operational amplifiers (107, 108).

As has been mentioned, under a further, very advantageous development of the invention also the absolute values of the response thresholds of the dead-zone member are to be adaptable between given lower and/or upper limit values, with the lower limits being able in the extreme case to become zero. For the simplified case of threshold values ($d_1 = d_2 = d$) lying symmetrically to the zero point of the dead-zone member.

Figure 2B:
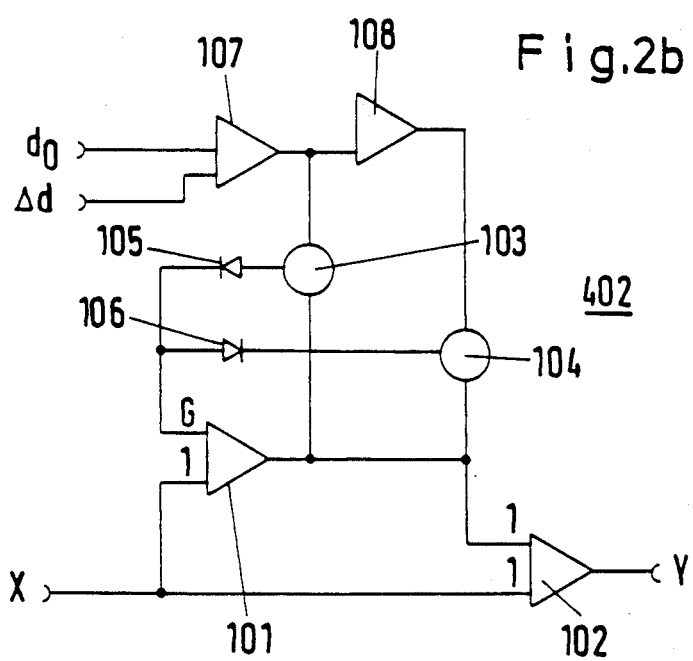
FIG. 2b shows a functional circuit diagram for the realization of an adaptive dead-zone member where the absolute value of response thresholds (lying symmetrical to the zero point ($d_1 = d_2 = d$) is adaptable.
Figure 2C:
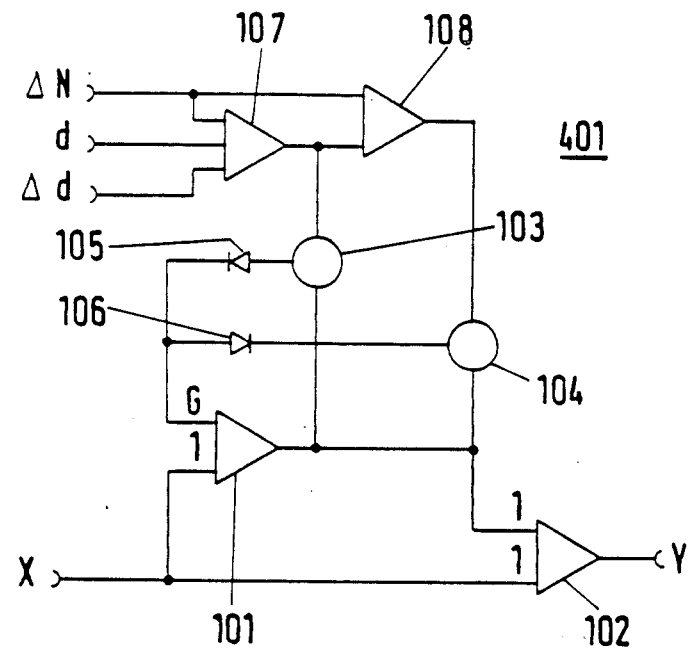
FIG. 2c shows a functional circuit diagram for the realization of an adaptive dead-zone member where selectively the zero point of the dead-zone range and/or the absolute value of response thresholds lying symmetrically to the zero point ($d_1 = d_2 = d$) can be varied via adaptation signals.

FIG. 2b shows a wiring diagram modified relative to FIG. 2a in such a way that an alteration of the absolute threshold value controllable through a suitable adaptation signal becomes possible, and FIG. 2c shows in schematic representation, an arrangement which combines the adaptive adjustment options of FIGS. 2a and 2b.

As is readily evident from the illustrations when the mechanism of action explained in connection with FIGS. 1b and 2a is known, the extensions according to the invention merely require a different wiring of the additional operational amplifiers (107) and (108). Nor does a realization of different adaptable threshold values ($d_1$, $d_2$) placed unsymmetrically to the zero point require further explanations. And there is no need to mention that dead-zone members having the aforesaid adaptive features can be realized in a different manner, and in part even better than, e.g., with the use of comparators and switching transistors instead of the described diodes.

Figure 3A:
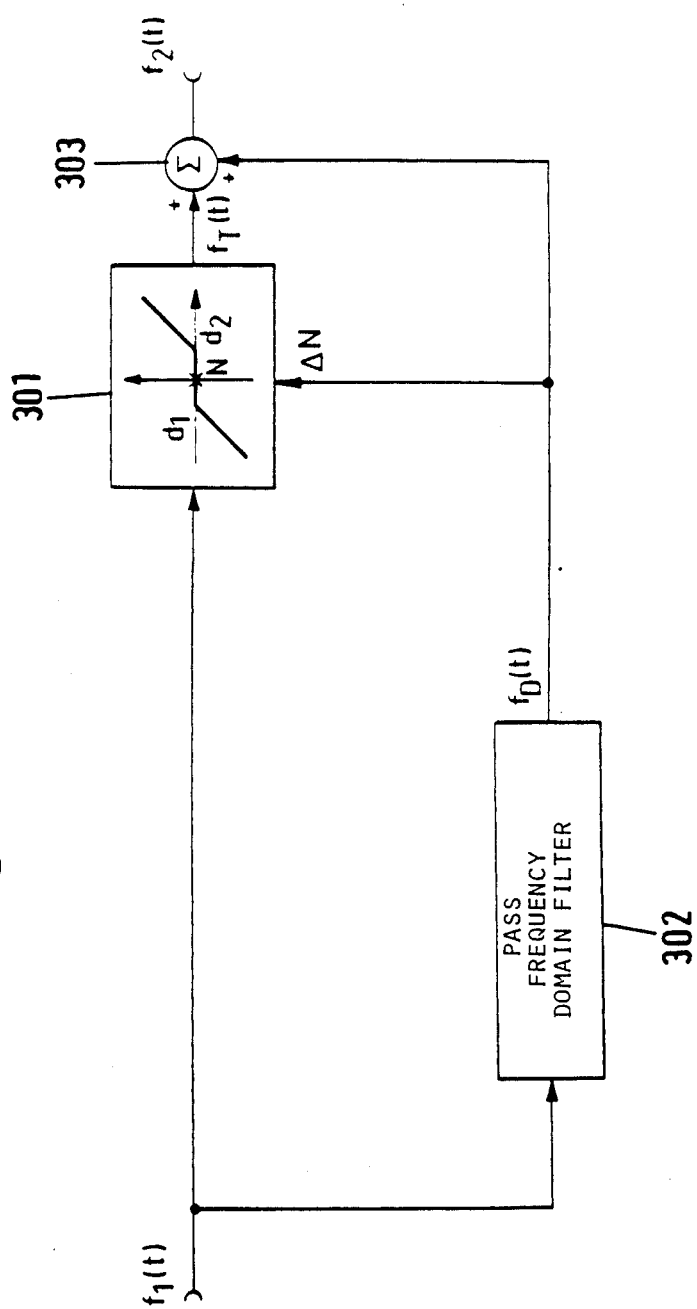
FIG. 3a shows a schematic representation of an adaptive, nonlinear frequency range filter according to the invention.

FIG. 3a shows the basic construction of a nonlinear adaptive filter according to the invention. Accordingly, an input signal ($f_1(t)$) to be filtered is supplied in parallel branches firstly to the input of the previously described adaptable dead-zone member (301) and to a pass frequency domain filter (302). The output signal ($f_D(t)$) of this passband filter is introduced both into the dead-zone member for adjustment of its zero point (N) by an adaptation value ($\Delta N$) and also into a summing stage (303) which links this signal ($f_D(t)$) to the output signal ($f_T(t)$) of the dead-zone member additively to the filter output signal ($f_2(t)$). To explain the mechanism of action of the filter of the invention let it be assumed that the task is to free a low-frequency wanted signal of an amplitude (A) and a frequency ($\Omega$) from a high-frequency unwanted signal of another amplitude (a) and other frequency ($\omega$), that is, to obtain the wanted signal component from a time function of the form $$f_1(t) = A * sin(\Omega t) + a * sin(\omega t)$$ (6)

In this case the pass-band filter must be designed as e.g. a linear low-pass filter with a band width (B) lying between the wanted and unwanted signal frequency:

$$\Omega < \omega_B < \omega \tag{7}$$

The adjustment signal ($f_D(t)$) formed in the zero point adaptation branch will essentially have the form $$f_D(t) = A_1 \sin(\Omega t + \rho) + \epsilon(t) \tag{8}$$

this signal differing little from the wanted signal as to amplitude and phase in the pass range of the filter ($A_1 \simeq A, \rho \simeq 0$), and the unwanted signal component ($\epsilon(t)$) lying in the stop range of the low-pass filter being negligible. In consideration of the effect of the zero point displacement of the dead-zone member with the function ($f_D(t)$), there will appear at the output of the dead-zone member a signal of the form:

$$f_T(t) = \begin{cases} f_1(t) - f_D(t) - d_1 & \text{for } f_1(t) - f_D(t) < d_1 \leq 0 \\ 0 & \text{for } d_1 \leq f_1(t) - f_D(t) \leq d_2 \\ f_1(t) - f_D(t) > d_2 & \text{for } f_1(t) - f_D(t) > d_2 \geq 0 \end{cases} \tag{9}$$

Again the correct sign of the threshold values ($d_1 \leq 0$, $d_2 \geq 0$) must be watched.

In the then following summing stage (303) there is superposed, according to FIG. 3a, on the output signal of the adaptive dead-zone member ($f_T(t)$) the signal ($f_D(t)$) serving for zero point adaptation, to the output signal of the form $$f_2(t) = f_T(t) + f_D(t) \tag{10}$$

Assuming, in the interest of simplicity, that the threshold values of the dead-zone member are symmetrical to the zero point ($|d_1| = |d_2| = d$), we obtain as output signal of the filter $$f_2(t) = \begin{cases} [f_1 - f_D + d] + f_D & \text{for } f_1 - f_D < -d \leq 0 \\ 0 & \text{for } -d \leq f_1 - f_D \leq +d \\ [f_1 - f_D - d] + f_D & \text{for } f_1 - f_D > d \geq 0 \end{cases} \tag{11}$$

For comprehension of the function we shall now consider the three essential frequency ranges, namely the pass band, stop band and transition or intermediate frequency band of the zero point adaptation branch:

In the pass band of the example here considered, i.e. in the range of low frequencies, the zero point control of the dead-zone member occurs practically error-free following the wanted signal and thus causes its suppression in the dead-zone member (301). This missing signal component at the output of the dead-zone member is, however, added in again via the adaptation branch in the then following summing member (303). The dead zone (of the width ±d) thus "rides" as it were on the wanted signal amplitude and suppresses all additively superposed high-frequency unwanted signal components, no matter of what frequency, provided they lie outside the frequency range of the zero point adaptation branch and the amounts of their amplitudes do not exceed the dead-zone width (d). If in particular the interference amplitude is known and the dead-zone width adapted accordingly, the dead zone is completely filled by the high-frequency signal and thereby brings about at the same time an extensive linearization of the nonlinear input/output characteristic of the dead-zone member in the manner of a so-called dither signal. In the practice, of course, the unwanted signal components will often consist of a frequency mix, including in particular noise components, of which at best spectral distributions or statistic mean values are known. The dead-zone width is then expediently adjusted to such statistic mean values as root square mean, variance ($\delta$), and/or multiples thereof, e.g. the so-called $2\delta$ or $3\delta$ value. In this case, not complete suppression of the unwanted signal components, but a considerable improvement of the signal-to-noise ratio is obtained.

If in a nonlinear filter thus tuned according to the embodiment of the invention brief variations of the input signal occur, these are relayed to the output in the main branch of the filter (FIG. 3a) without phase shift over the dead-zone member directly and without delay, as the adaptation branch cannot follow such variations and the zero point of the dead-zone member remains unchanged. These variations, however, are reflected in the output signal only in the mean of the high-frequency signal components exceeding the dead-zone range, and this leads to a brief deterioration of the signal-to-noise ratio occurring only during the transition phase until the adaptation branch follows but disappearing after adjustment of the steady state. Such conditions occur in particular if through suitable commands desired changes in the operating conditions or operating points are entered in a system containing the filter of the invention. Similar conditions as described in connection with brief changes of the operating point apply also in the transition range of the zero point adaptation branch. Input signals whose frequencies lie between the pass band and stop band of the frequency domain filter disposed in the zero point adaptation branch undergo a change in amplitude and phase and thus lead to a corresponding error in the zero point tracking of the adaptive dead-zone member. Nevertheless, the filter input signal ($f_1(t)$) is conducted through to the filter output ($f_2(t)$) via the phase-insensitive dead-zone member (301) and the following summing stage (303). To visualize this, assume for the time being the dead-zone range taken to be zero by appropriate selection of the signals controlling it (FIGS. 2b, 2c). Referring to FIG. 3a and equation (11) describing it, the dead-zone member then degenerates to a strictly linear input/output characteristic, the zero point of which remains displaceable by means of a signal ($f_D(t)$) via the adaptation branch. This eliminates the need for the distinction made between negative and positive amplitude ranges, and the describing equation (11) will have the form $$f_2(t) = f_1(t) - f_D(t) + f_D(t) = f_1(t) \tag{11a}$$

which means that for any desired zero point displacement signal ($f_D(t)$) the filter output signal ($f_2(t)$) remains identical with the input signal ($f_1(t)$) as to amplitude and phase. If, however, a dead zone for suppression of undesired signal components exists, amplitude and phase deviations of the zero point displacement signal ($f_D(t)$) relative to the filter input signal ($f_1(t)$) in the intermediate frequency range considered will have the result that the unwanted signals which essentially fill the dead-zone range and which actually should be suppressed exceed the response thresholds ($d_1$, $d_2$, d) and their mean value resulting from the rectifier effect of the dead-zone characteristic reflects the undelayed input signal with good approximation. Depending on the nature of the signal spectrum in the intermediate frequency range considered, there occur for these signals more or less small amplitude distortions and residual components of unsuppressed high-frequency interference signals, the latter of which can, if necessary, be further attenuated by additionally connected filters.

Figure 3B:
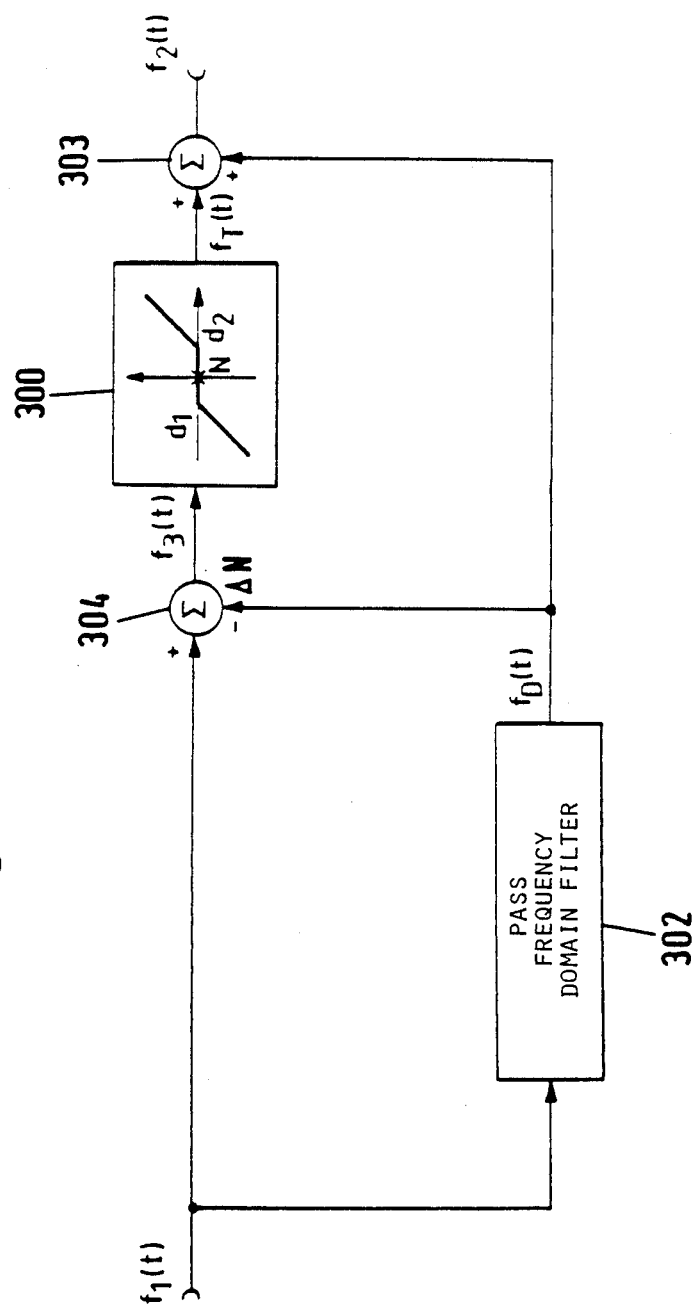

FIG. 3b shows in schematic representation another possibility for achieving the effects according to the invention obtainable by zero point displacement of the dead-zone member. In this case the effect caused by zero point displacement of the input/output characteristic of a dead-zone member is achieved by supplying to an ordinary, non-adaptable dead-zone member (300) the difference formed in a preceding summing member (304) between the filter input signal ($f_1(t)$) and a signal ($f_D(t)$) generated in a zero point adaptation branch via a pass band filter (302). Although generally linear and nonlinear circuit elements cannot be interchanged without affecting the mechanism of action of a circuit, in the present case this measure is entirely identical with the realization of a zero point displacement of the dead-zone member according to the embodiments of FIGS. 2a and 2c and can be employed selectively, for example, if thereby the cost of realization can be reduced.

Figure 3C:
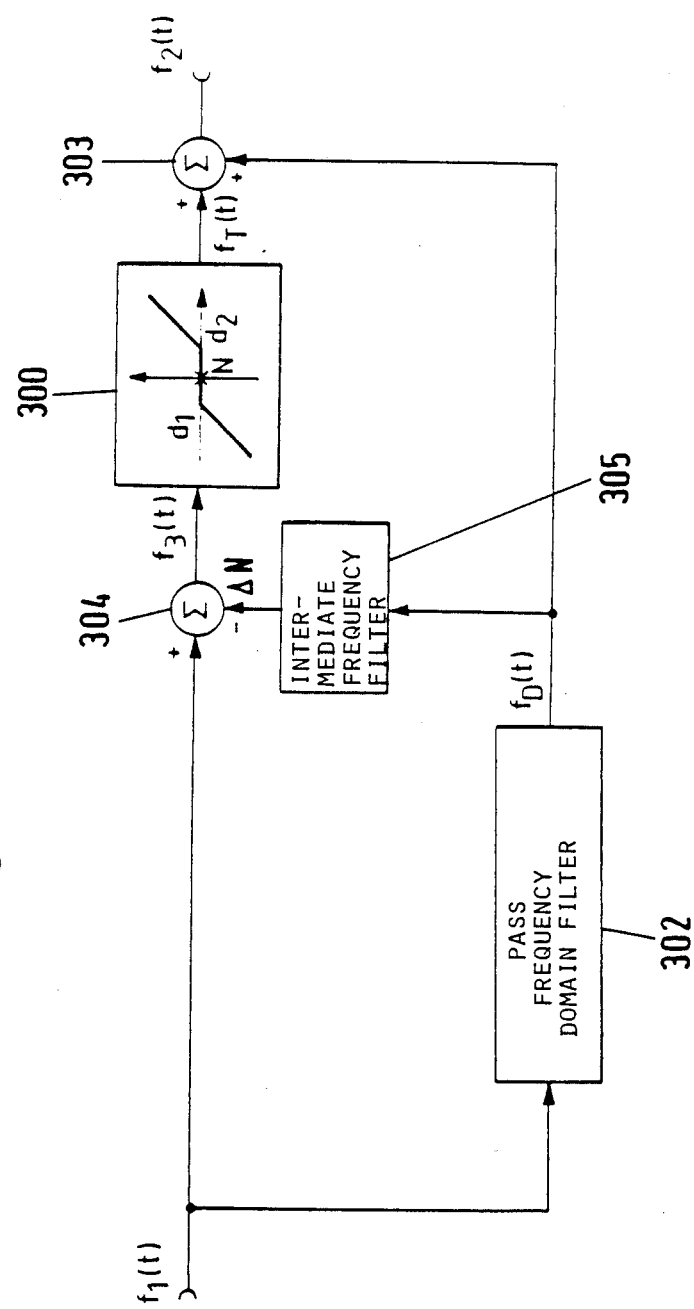
FIG. 3c shows an extension of the invention per FIGS. 3a and 3b for improving the dynamic behavior in the intermediate frequency range.

FIG. 3c shows a further development of the invention which serves to further improve the transmission behavior in the intermediate frequency range. This is achieved by inserting an intermediate frequency filter (305) between the output of the pass band filter and the summing member (304). Undesired changes in amplitude and phase caused by the pass band filter can thus be corrected to a large extent, and at the same time possible amplitude distortions of the input/output characteristic originating from the effect of the dead zone can be further linearized. It is obvious that the transmission properties of the intermediate-range filter must be matched to the pass-band filter and that therefore, for example if the latter is designed as a low-pass filter, intermediate range filters forming in particular amplitude elevation or respectively phase lead, such as high-pass filters, band-pass filters and lead members are suitable.

As is familiar to any specialist, all linear transmission members, which for elucidation of the idea of the invention have been shown separately and discussed as to their influence concerning the purpose of the invention, can be converted by linear transformations to equivalent circuits and networks. This is true in particular of the pass-band filter (302), the intermediate frequency filter (305) and the linkage of the zero point adaptation signal with the input signal in the summing member (304).

Now in practice, the case often occurs that the signal conditions vary, in particular with respect to their interference components, depending on the prevailing operating and environmental conditions, such as temperature fluctuations, aging and the like. According to a further development of the invention it can be achieved that the quality of the interference suppression is preserved with respect to amplitudes and spectral distribution despite operation-connected changes of the interference level. Such advantageous properties of a nonlinear filter of the above described kind are ensured according to the invention by the fact that the absolute values of the response thresholds of the dead-zone member are changed by an additional adaptive intervention in dependence on signals which are obtained from the filter input signal by averaging over all signal components lying within one or more selected frequency ranges of the interference spectrum. The adaptation can occur continuously or in discrete steps. In case of interference fluctuations which only occur over very long periods of time, the adjustment of the threshold values can, of course, be carried out also externally or possibly by hand.

FIG. 4a shows the basic circuit diagram of an improved filter of the mentioned kind. The nonlinear, very largely phase-correct frequency domain filter according to FIG. 3a has here been extended by a threshold value adaptation branch which, like the zero point adaptation branch, is fed by the filter input signal ($f_1(t)$), and whose output signals ($f_{41}(t)$, $f_{42}(t)$) are used for shifting the response thresholds ($d_1, d_2$) of the dead-zone member (401) lying in the main branch of the filter, for example in the manner shown in FIG. 2b or 2c. The additional adaptation branch itself consists of a stop band filter (403), a mean value former (404), a forming filter (405), an add-on function (406) and possibly a dead-zone member (407) of known type (e.g. as per FIG. 1b) with fixed preset response thresholds.

A linear frequency domain filter (403), here referred to as "stop band filter" for differentiation, serves to establish the frequency limits within which an adaptation of the dead zone is to take place in the dead-zone member of the main branch. Preferably high-pass filters or band-pass filters are used for this purpose, but also low-pass filters and, depending on the application, combinations of said filter types in suitable series and/or parallel connection. For the mean value formation (404) all circuits or components enter into consideration that are suitable for forming from the frequency mix at the output of the stop band filters (403) mean values different from zero or DC components, as for example half-wave rectifiers, full-wave rectifiers, peak rectifiers, as well as function elements forming even powers of their input signal, such as squarers and the like.

In the then following forming filter (405) of the threshold value adaptation branch per FIG. 4a, the output signal of the mean value former is smoothed, or respectively signal components of frequencies unsuitable for the threshold value adaptation, e.g. high frequencies, are suppressed, for which purpose first- or higher order low-pass filters or band blocking filters are especially suitable By the add-on function (406) of the adaptation branch it is established by what functional relationship the response thresholds of the dead-zone member are to be adapted in the central main branch of the filter. In the simplest case this may involve linear amplification characteristics with output signal limitation, the limitation making sure that no undesirably great enlargements of the dead-zone range and signal suppression in the pass band connected therewith can occur. In general, however, suitable nonlinear amplification characteristics matched to the characteristic of the mean value formation, as for instance inverse square characteristics corresponding to square root functions, logarithmic characteristics or functions and the like may be more appropriate to comply with the respective requirements. In many cases it is advisable, according to the invention, to connect after the add-on function a dead-zone member (407) with invariable response thresholds (FIG. 1b) for suppression of the inevitable residual ripple of the threshold value adaptation signal, and also to ensure a defined lower limit of the threshold value adaptation. In particular it is possible to achieve, by an unsymmetrical add-on function and/or by dead-zone members with left-side or right-side threshold values of different amount and/or by amplifications in the adaptation branch considered here, a correspondingly unsymmetrical displacement of the response thresholds in the dead-zone member (401) of the main branch of the filter.

It is evident from the statements concerning FIGS. 3a and 3c, in particular with regard to the phase correctness of the filter transmission for a dead-zone width of 0 or small values even in the intermediate ranges where the pass-band filter already shows amplitude and phase changes of the wanted signal, that for the transmission behavior of the nonlinear frequency domain filter the starting edge of the amplitude drop begins essentially at the point where the threshold value adaptation branch begins to open the dead-zone range for the suppression of the interference signal amplitudes. If this point of inception occurs at frequencies which lie substantially higher than the band width of the pass range for the zero point displacement, phase-correct transmission remains ensured up to this frequency.

Figure 4B:
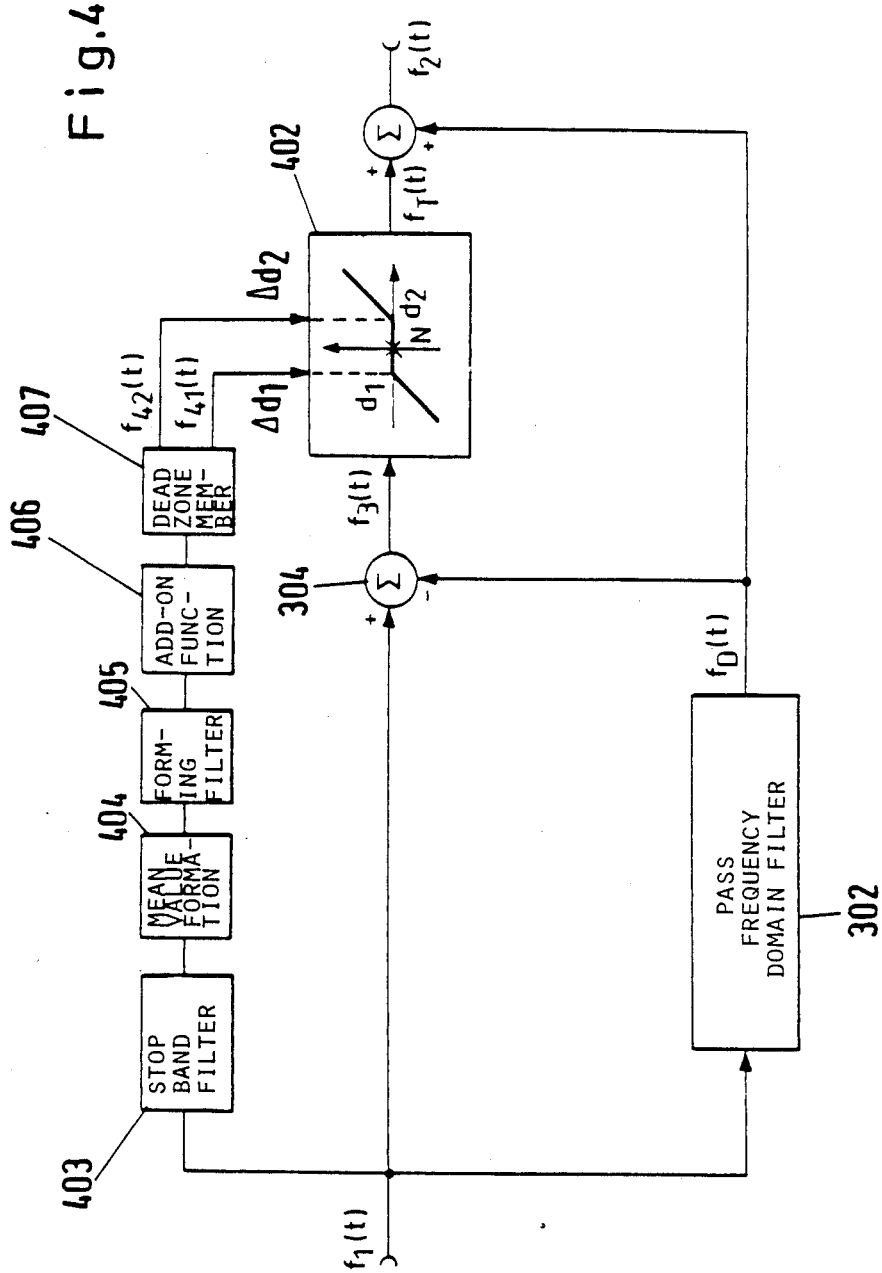

FIG. 4b in turn shows a form of realization of the enlarged, nonlinear filter according to the invention where in a manner already described with reference to FIG. 3b the zero point adaptation of the dead-zone member is replaced by a difference formation between the input signal ($f_1(t)$) and the zero point displacement signal ($f_D(t)$) in a summing member (304) before the input of the dead-zone member.

FIG. 4c shows the block diagram of a nonlinear, enlarged adaptive filter according to the invention, where for further improvement of the dynamic behavior and compensation of amplitude distortions in the transition range an intermediate frequency filter (305) is provided, whose function and transmission features have been described already in connection with FIG. 3c.

Figure 5A:
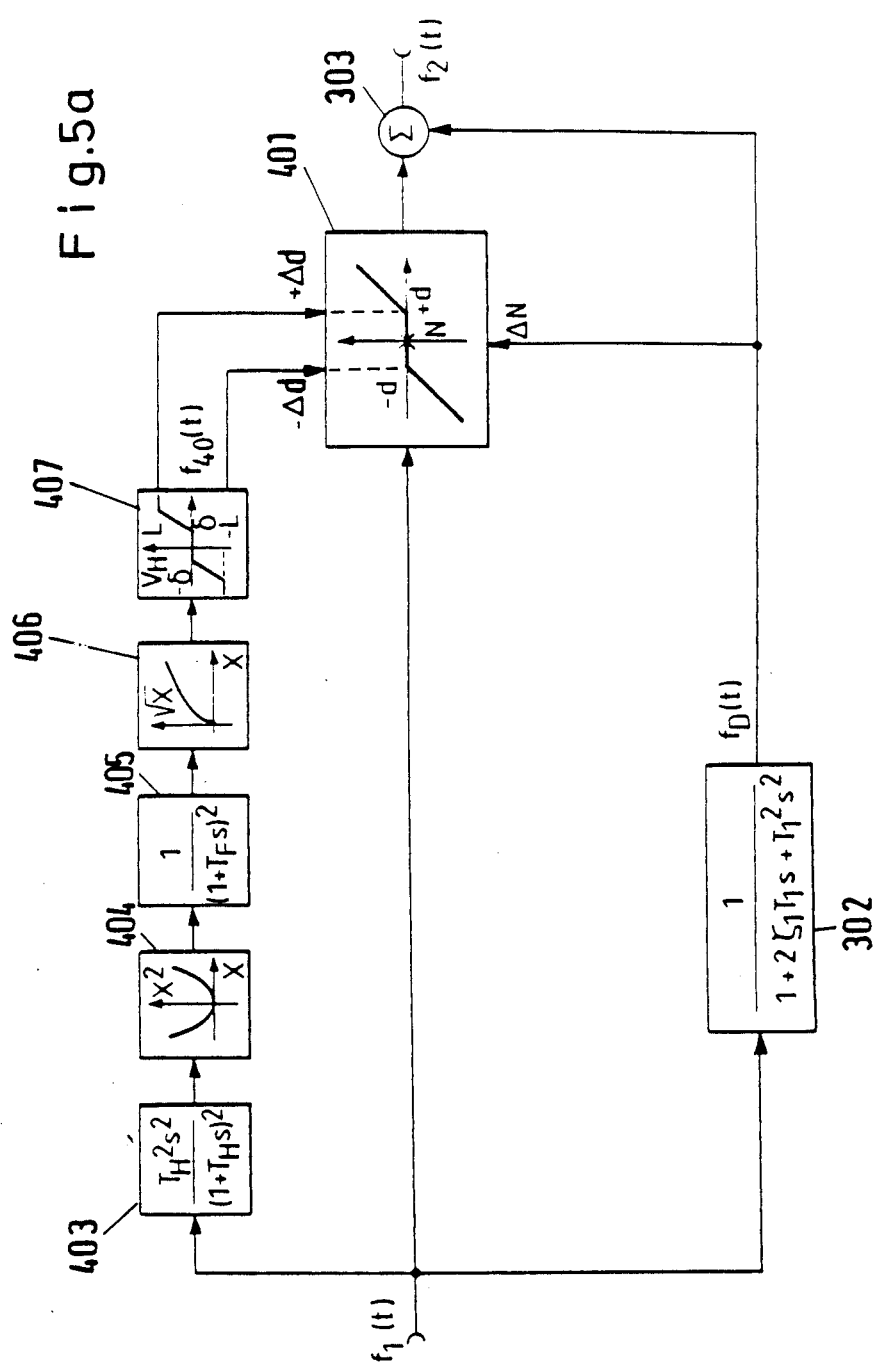
FIGS. 5a, 5b and 5c show examples of a double adaptive, nonlinear frequency domain filter per FIGS. 4a, 4b and 4c.

FIG. 5a shows an embodiment of the nonlinear frequency domain filter of low phase loss according to the invention in its extended, double adaptive form. In accordance with the elucidations regarding the mode of operation of a first form of realization of the invention per FIGS. 3a and 3b, there was assumed in the zero point adaptation branch a low-pass behavior which in the present case is ensured by an ordinary second order low pass filter with a filter time constant ($T_1$) and an attenuation ($\xi_1$). To illustrate the functional properties described by FIGS. 4a and 4b, there are shown in the threshold value adaptation branch the various circuit elements again in the form of transmission functions or input/output characteristics. Accordingly, the adaptation branch consists of a second order linear high-pass filter (403) as stop band filter, a squarer (404) for mean value formation, a first-order double linear low- pass filter (405) as forming filter, a square root former (406) as add-on function, and a following dead-zone member (407) with invariable response thresholds ($\pm\delta$), an amplifier stage ($V_H$) in the linear characteristic range, and output signal limitation ($\pm L$). To simplify matters it has further been assumed that the threshold value adaptation in the dead-zone member of the main branch occurs symmetrically to the zero point and that the latter's displacement is obtained with the output signal ($f_D(t)$) of the pass band filter (302) in the dead-zone member, for instance per FIG. 2c.

Figure 5B:
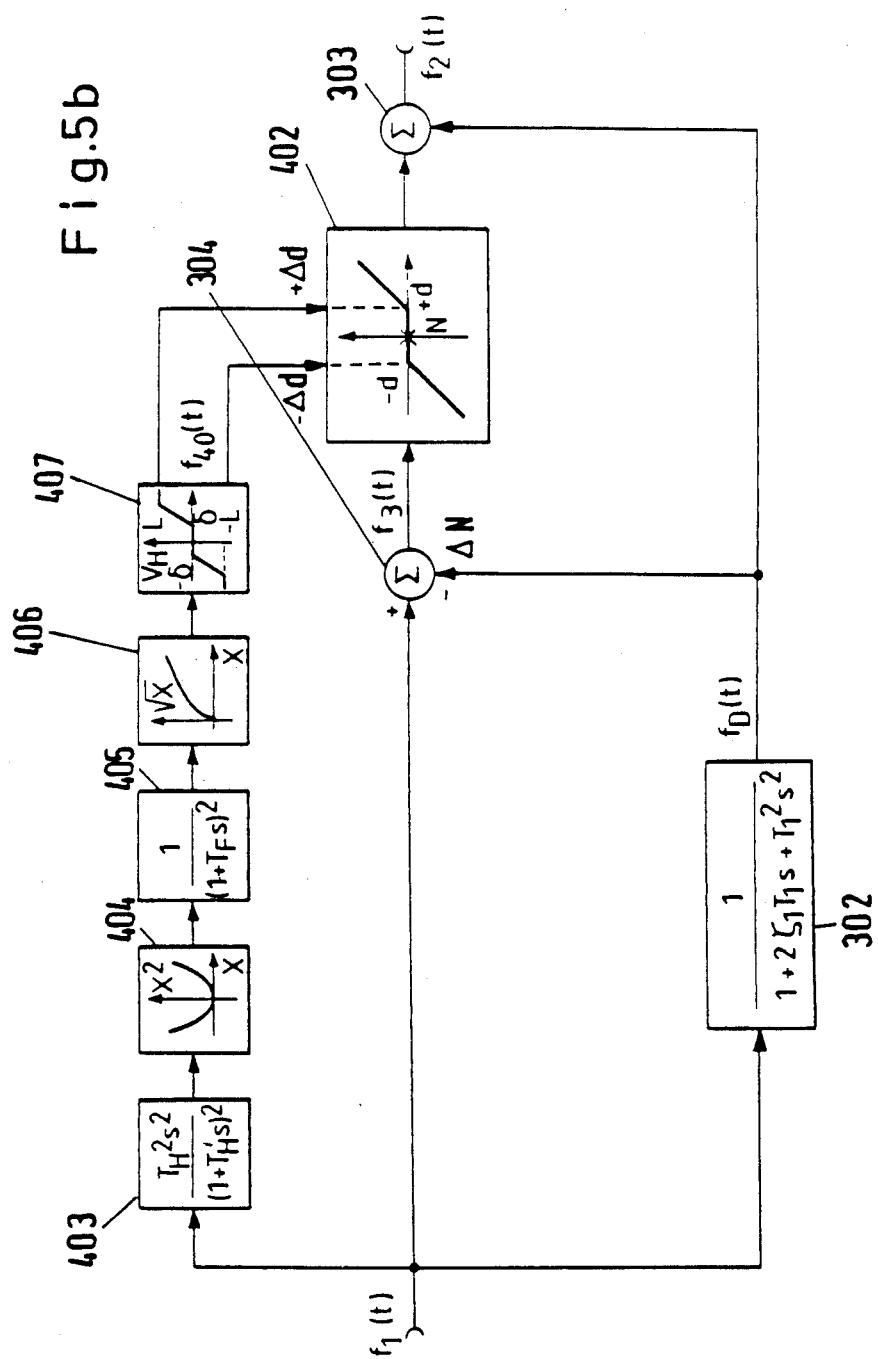

FIG. 5b shows the embodiment of FIG. 5a in a slightly modified form, namely in that the dead-zone member in the main branch of the filter is carried out merely adaptively in threshold values of its dead-zone range, for instance per FIG. 2b, and its zero point displacement takes place via the previously described difference formation in the preceding summing member (304).

Figure 5C:
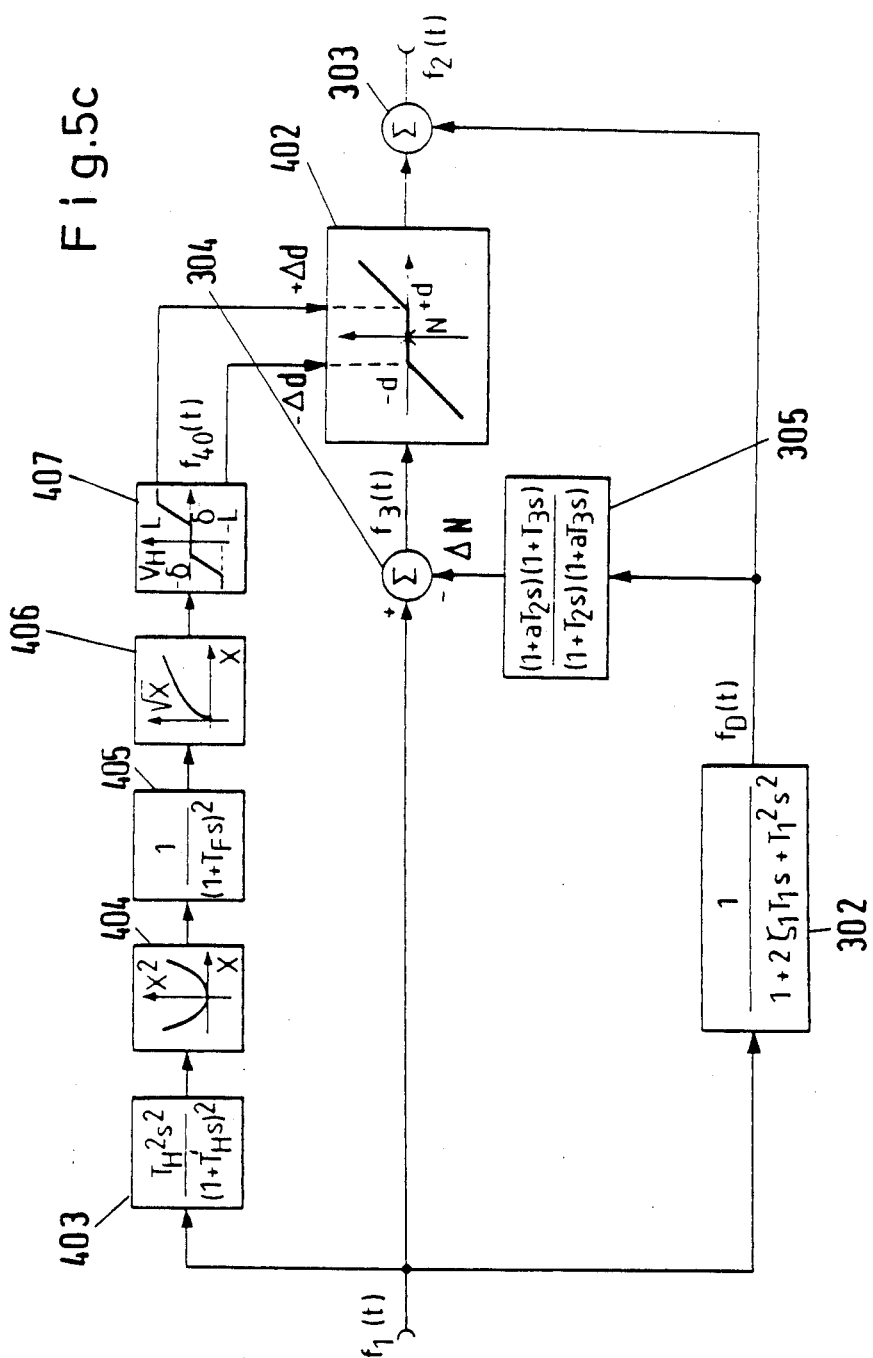

FIG. 5c shows an extension of the above described embodiment by an intermediate frequency filter (305) to improve the dynamic behavior and the input/output characteristic in the transition range from the wanted to the unwanted spectrum of the input signal ($f_1(t)$) to be filtered. In this case the intermediate frequency filter (305) is designed as a simple, symmetrical band-pass filter, the parameters being expediently chosen in the following relation to each other:

$$T_1 < aT_2 < T_2 < aT_3 < T_3 < T_H \qquad (12)$$

to obtain the mentioned amplitude elevation (a) and phase lead in the intermediate frequency range.

The execution, in terms of apparatus, of the functional elements of the adaptation branches described above as to their operation and transmission properties, such as filters, rectifiers, linear and nonlinear input/output characteristics, presents no difficulties whatever to a person of skill in the art. The conversion of the filter transmission functions and input/output characteristics, given in analog representation, to corresponding digital circuits or algorithms for processing computers as realization aids is familiar to those skilled in the art also.

The embodiment of a double adaptive, nonlinear low-pass filter described in FIG. 5a was realized with the aid of analog components and its frequency response plotted. FIGS. 6a and 6b show the measured amplitude curve (6a) and phase curve (6b) as a function of the frequency for sinusoidal input signals for the following parameter values:

$T_1 = 1.4$ sec
$\xi_1 = 0.6$
$T_H = 0.1$
$T_F = 50$ sec
$V_H = \sqrt{2}$ for a linear input/output characteristic with an amplification ($V_H$) and dead zone ($\pm\delta$) equals zero of the degenerated "dead zone member" (407). The advantages of the nonlinear low-pass filter according to the invention are seen when comparing, e.g., the amplitude and phase with those of the normal, second order linear pass band filter. The shape of the two frequency responses is illustrated in FIGS. 6a and 6b.

It is obvious that besides the examples and forms of realization of the adaptation branches chosen to explain the invention, also other realizations, filter types, as well as linear and nonlinear transmission elements can, depending on the specific use, be employed in the arrangement according to the invention. In particular, in both described adaptation branches appropriate series and parallel connections of individual filters or transmission members may be used and in consistent pursuit of the invention also complete adaptation branches may be used for the realization of overlapping or mutually exclusive sub-areas of the adaptation over selected frequency and/or amplitude ranges. In designing the adaptation branches it should be noted that, due to the mean value formation contained in it, the threshold value adaptation branch reacts only to signal amplitudes, not to phase conditions. It follows therefrom that the starting edges of the frequency ranges limiting the interference spectra to be suppressed can be defined very sharply by using high order filters, without adverse effect of the resulting phase shift on the output signal of the nonlinear filter.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A nonlinear frequency domain filter for the suppression of unwanted signals which are superposed on a wanted signal variable in a given frequency range, comprising a dead-zone member and a pass-band filter, the dead-zone member having a zero point, an input for receiving an input signal to be filtered and an output for providing an output signal, the pass-band filter having an input for receiving said input signal and also having an output for providing an output signal, said input signal comprising said wanted signal and said unwanted signals, and further comprising means for zero point adaptation of said dead-zone member such that the zero point follows proportionally said output signal of the pass-band filter, the output signal from the pass-band filter further being added to the output signal from the dead-zone member to provide an output signal of the filter.

2. A nonlinear frequency domain filter for the suppression of unwanted signals which are superposed on a wanted signal variable in a given frequency range, the wanted signal and the unwanted signals forming a filter input signal, comprising a dead-zone member, a pass-band filter and a difference-forming member, the dead-zone member having a zero point, an input for receiving an input signal to be filtered and an output for providing an output signal, the pass-band filter having an input for receiving the filter input signal and further having an output for providing an output signal, the difference-forming member having a first input for receiving as a first input signal the filter input signal, a second input for receiving as a second input signal the output signal from the pass-band filter and an output coupled to the input of the dead-zone member and providing an output signal comprising the difference of said first and said second input signals, said output signal from said pass-band filter further being added to the output signal from the dead-zone member to provide an output signal of the filter.

3. The frequency domain filter recited in claim 1, further comprising an additional intermediate frequency filter having the output signal of the pass-band filter as an input and having an output coupled to said input of said dead-zone member.

4. The frequency domain filter recited in claim 1, wherein said pass-band filter comprises at least one of a low-pass filter, band-pass filter, high-pass filter or a combination of such filter types.

5. The frequency domain filter recited in claim 3, wherein the additional intermediate frequency filter comprises at least one of a low-pass filter, band-pass filter, high-pass filter or a combination of such filter types.

6. The frequency domain filter recited in claim 1, wherein the dead-zone member has two response thresholds, and further comprising a threshold value adaptation branch having said input signal as an input and having at least one output signal coupled to said dead-zone member for adapting absolute values of the response thresholds at least one of continuously and/or in discrete steps automatically and/or manually.

7. The frequency domain filter recited in claim 6, wherein said threshold value adaptation branch for the adaptation of the absolute value of the response thresholds of the dead-zone member comprises means for averaging over all signal components lying within one or more selected frequency ranges.

8. The frequency domain filter recited in claim 6, wherein the threshold value adaptation branch for adaptation of the response thresholds of the dead-zone member comprises a stop band filter receiving said input signal and having an output signal coupled to a mean value former, the mean value former having an output coupled to a forming filter, the forming filter having an output coupled to add-on functions means.

9. The frequency domain filter recited in claim 8, wherein the threshold value adaptation branch comprises a further dead-zone member, said further dead-zone member having additional response thresholds, said additional response thresholds being adjustable to preset fixed values.

10. The frequency domain filter recited in claim 8, wherein the stop band filter in the threshold value adaptation branch comprises one of a high-pass filter, band-pass filter, low-pass filter, band blocking filter, or combinations of said filter types.

11. The frequency domain filter recited in claim 8, wherein the mean value former in the threshold adaptation branch comprises one of a half-wave rectifier, full-wave rectifier, peak rectifier, or a functional element forming even powers of an input signal.

12. The frequency domain filter recited in claim 8, wherein the forming filter in the threshold value adaptation branch comprises one of a low-pass filter, band blocking filter, band-pass filter, or combinations of said filter types.

13. The frequency domain filter recited in claim 8, wherein the add-on function means in the threshold value adaptation branch comprises linear and/or nonlinear characteristic means.

14. The frequency domain filter recited in claim 13, wherein the add-on function means comprises one of an amplifier with amplitude limitation or a functional element forming a square root.

15. The frequency domain filter recited in claim 8, wherein the pass-band filter comprises a first or second order low-pass filter, the intermediate frequency filter comprises a lead member or band-pass filter and, in the threshold value adaptation branch, the stop band filter comprises a first or second order high-pass filter, the mean value former comprises a rectifier or squarer, the forming filter comprises a first or second order low-pass filter, the add-on function means comprises a linear amplifier or square root function means, and a dead-zone member with fixed preset response thresholds and amplitude limitation is coupled to an output of the add-on function means.

16. The frequency domain filter recited in claim 1, wherein the dead-zone member has adaptable zero point and/or adaptable threshold values and comprises a first amplifier receiving an input signal and having an output signal, the output signal being supplied via two potentiometers and via oppositely connected diodes connected to respective taps of the potentiometers, to an input of the first amplifier and further comprising a second amplifier having the output of said first amplifier as an input and further having said input signal as an input, for summing said input signal and the output signal of said first amplifier, at the respective other end of the potentiometers, signals corresponding to the threshold values and/or to the zero point adaptation being supplied to said potentiometers.

17. The frequency domain filter recited in claim 16, further comprising third and fourth amplifiers supplied with said threshold values and/or the zero point adaptation, said third and fourth amplifiers having outputs coupled to respective other ends of the potentiometers.

18. The frequency domain filter recited in claim 1, wherein the pass-band filter and the dead-zone member comprise wholly or partly functionally equivalent algorithms in a hard wired or programmable digital electronic system.

19. The frequency domain filter recited in claim 2, comprising an additional intermediate frequency filter having the output signal of the pass-band filter as an input and having an output coupled to said second input of said difference-forming member.

20. The frequency domain filter recited in claim 2, wherein said pass-band filter comprises at least one of a low-pass filter, band-pass filter, high-pass filter or a combination of such filter types.

21. The frequency domain filter recited in claim 2, wherein the additional intermediate frequency filter comprises at least one of a low-pass filter, band-pass filter, high-pass filter or a combination of such filter types.

22. The frequency domain filter recited in claim 2, wherein the dead-zone member has two response thresholds, and further comprising a threshold value adaptation branch having said input signal as an input and having at least one output signal coupled to said dead-zone member for adapting absolute values of the response thresholds at least one of continuously and/or in discrete steps automatically and/or manually.

23. The frequency domain filter recited in claim 2, wherein said threshold value adaptation branch for the adaptation of the absolute value of the response thresholds of the dead-zone member comprises means for averaging over all signal components lying within one or more selected frequency ranges.

24. The frequency domain filter recited in claim 2, wherein the dead-zone member has adaptable threshold values and comprises a first amplifier receiving an input signal and having an output signal, the output signal being supplied via two potentiometers and via oppositely connected diodes connected to respective taps of the potentiometers, to an input of the first amplifier and further comprising a second amplifier having the output of said first amplifier as an input and further having said input signal as an input, for summing said input signal and the output signal of said first amplifier, at the respective other end of the potentiometers, signals corresponding to the threshold values being supplied to said potentiometers.

25. The frequency domain filter recited in claim 2, further comprising third and fourth amplifiers supplied with said threshold values, said third and fourth amplifiers having outputs coupled to respective other ends of the potentiometers.

* * * * *